(12) United States Patent
Sakai

(10) Patent No.: US 6,872,656 B2
(45) Date of Patent: Mar. 29, 2005

(54) SEMICONDUCTOR DEVICE AND METHOD OF FABRICATING THE SAME

(75) Inventor: Katsuhisa Sakai, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/462,699

(22) Filed: Jun. 17, 2003

(65) Prior Publication Data

US 2004/0121587 A1 Jun. 24, 2004

(30) Foreign Application Priority Data

Dec. 24, 2002 (JP) ........................................ 2002-371842

(51) Int. Cl.⁷ .......................................... H01L 21/4763
(52) U.S. Cl. ...................................... 438/637; 438/635
(58) Field of Search ........................................ 438/637

(56) References Cited

U.S. PATENT DOCUMENTS

| | | | | |
|---|---|---|---|---|
| 5,007,981 A | * | 4/1991 | Kawasaki et al. | ........... 134/1.2 |
| 5,135,608 A | * | 8/1992 | Okutani | ...................... 438/584 |
| 5,200,017 A | * | 4/1993 | Kawasaki et al. | ..... 156/345.31 |
| 6,448,651 B1 | | 9/2002 | Kim | |

FOREIGN PATENT DOCUMENTS

| | | | |
|---|---|---|---|
| JP | 11-330241 | * | 11/1999 |
| TW | 430973 | | 4/2001 |
| TW | 468225 | | 12/2001 |

* cited by examiner

*Primary Examiner*—David Nelms
*Assistant Examiner*—Thao P. Le
(74) *Attorney, Agent, or Firm*—McDermott Will & Emery LLP

(57) ABSTRACT

A semiconductor device includes a first interconnection, an interlayer insulation film covering the first interconnection a contact hole provided in the interlayer insulation film and reaching the first interconnection, a first barrier metal and a tungsten plug provided in the contact hole, an oxide film provided at a surface of the tungsten plug, and a second barrier metal and a second interconnection provided on the oxide film.

5 Claims, 17 Drawing Sheets

SEMICONDUCTOR DEVICE AND METHOD OF FABRICATING THE SAME

BACKGROUND OF THE INVENTION

1. Field of the Invention

The present invention relates generally to semiconductor devices and methods of fabricating the same, and particularly to semiconductor devices having an interconnection structure providing a plug for example of tungsten in a contact hole between multilayer interconnections for electrical conduction and methods of fabricating the same.

2. Description of the Background Art

A method of providing a tungsten plug in a conventional semiconductor device is described for example in Japanese Patent Laying-Open No. 11-330241.

As described in Japanese Patent Laying-Open No. 11-330241, initially at a substrate provided with a contact hole a barrier metal is provided and thereon tungsten is provided in a film. Subsequently the tungsten is etched back to form a plug. Note that when the tungsten is being overetched the barrier metal and fluorine supplied from an etchant gas react with each other and adhere on the barrier metal, forming a reaction product. Subsequently, the substrate remains in the same chamber, rather than being transported to a different chamber, and is processed with an $O_2$ plasma. The processing with the plasma oxidizes a surface of the barrier metal, including a region corresponding to the reaction product, to provide an oxide film layer. As a result, short circuit of a pattern on the barrier metal, or the like can be prevented.

As disclosed in Japanese Patent Laying-Open No. 11-330241, however, an oxide film layer and a reaction product layer exist between a tungsten plug and an overlying interconnection. As such, the reaction product can hardly be controlled in thickness. This results in an unstable electric resistance value between the tungsten plug and the overlying interconnection.

Furthermore, as disclosed in Japanese Patent Laying-Open No. 11-330241, the processing chamber in which the tungsten is etched back is also used for a subsequent ashing step, and an oxide gas is introduced into an etching-back chamber for the ashing step. The gas oxidizes a reaction product deposited in the processing chamber, producing foreign matters. Furthermore, changing the atmosphere in the chamber between the etching-back and ashing steps entails a period of time before the atmosphere stabilizes, which is an obstacle to constant production.

SUMMARY OF THE INVENTION

The present invention contemplates a semiconductor device having an interconnection structure with a constant electric resistance value by removing a reaction product produced on a plug surface in etching-back, and in addition providing a stable oxide film, and a method of fabricating the semiconductor device.

In accordance with the present invention a semiconductor device is comprised of: a first conductive film; an interlayer insulation film covering the first conductive film; an opening provided in the interlayer insulation film and reaching the first conductive film; an oxide film provided at a surface of the first conductive film located in the opening; and a second conductive film provided in the opening to surround the oxide film.

In accordance with the present invention a method of fabricating a semiconductor device is comprised of the steps of: providing an interlayer insulation film covering a first conductive film; providing a contact hole in the interlayer insulation film to reach the first conductive film; providing a second conductive film disposed in the contact hole and also extending on the interlayer insulation film; etching the second conductive film back to provide a plug in the contact hole; thermally processing a surface of the plug in a processing chamber different from that used for the step of etching to decompose a reaction product introduced by the step of etching at the plug; and providing a third conductive film on the plug.

In accordance with the present invention an oxide film can be provided at a surface of the second conductive film to prevent a reaction product from remaining on the surface of the second conductive film. A semiconductor device having an interconnection which is stable, providing small resistance, can thus be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter a semiconductor device in accordance with the present invention and a method of fabricating the same of will be described in embodiments.

First Embodiment

Figure 4:
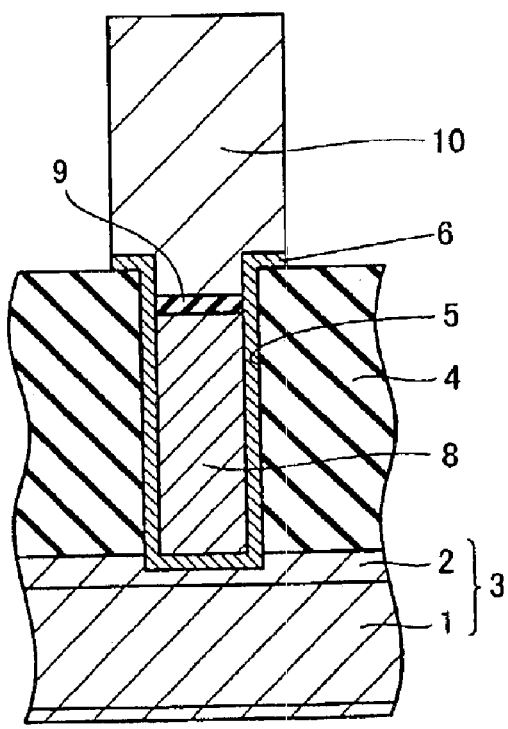
FIG. 4 is a cross section of the present semiconductor device in the first embodiment.

In the present embodiment a pattern of a hole having a diameter of no more than 0.80 μm is assumed. As shown in FIG. 4, the present embodiment provides a semiconductor device including a first interconnection 3 having an aluminum film 1 and an anti-reflection film 2 and serving as a first conductive film, an interlayer insulation film 4 covering the first interconnection 3, a contact hole 5 provided in interlayer insulation film 4 to reach the first interconnection 3, a first barrier metal film 6 and a tungsten plug 8 provided in contact hole 5 to serve as a second conductive film, an oxide film 9 provided at a surface of tungsten plug 8, and a second interconnection 10 provided on oxide film 9 to serve as a third conductive film. Note that tungsten plug 8 or the first barrier metal 6 may be replaced by tantalum or a tantalum compound.

The above semiconductor is fabricated in a method including the steps of: providing interlayer insulation film 4 to cover the first interconnection 3 serving as the first conductive film; providing interlayer insulation film 4 with contact hole 5 reaching the third interconnection 3, providing the first barrier metal 6 and tungsten film 7 provided in contact hole 5 and also extending on interlayer insulation film 4 to serve as the second conductive film, etching tungsten film 7 back to provide tungsten plug 8 in contact hole 5, ashing a surface of tungsten plug 8 to thermally process the surface to decompose a first reaction product 12 produced on a surface of tungsten plug 8 and that of the first barrier metal 6 in the step of etching; and providing the second interconnection 10 on tungsten plug 8 to serve as the third conductive film.

Hereinafter, the method of fabricating a semiconductor device in the present embodiment will more specifically be described.

Figure 1:
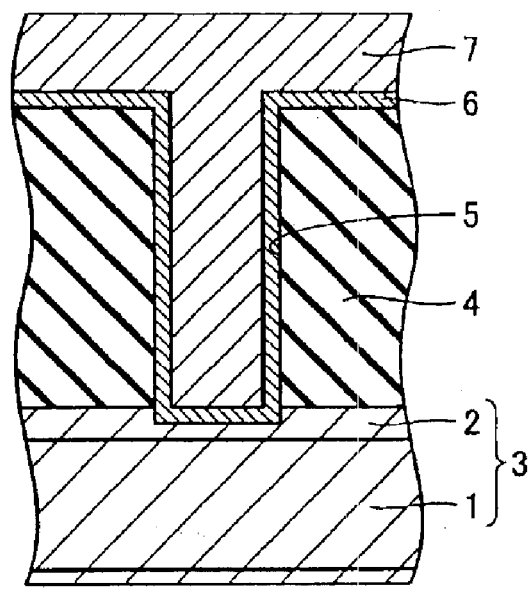
FIGS. 1–3 are cross sections illustrating first to third steps, respectively, of a process for fabricating a semiconductor device of the present invention in a first embodiment.

With reference to FIG. 1, the first interconnection 3 including anti-reflection film 2 and aluminum film 1 and serving as the first conductive film is initially provided for example by dry etching. Interlayer insulation film 4 is subsequently provided and then for example dry-etched to have contact hole 5 therein. In contact hole 5 the first barrier metal 6 containing at least one of tantalum or a tantalum-based compound, titanium or a titanium-based compound is provided for example by chemical vapor deposition (CVD) or sputtering to have a thickness of approximately 100 nm.

Then CVD is for example employed to provide tungsten film 7 serving as the second conductive film across an entire surface to have a thickness of approximately 400 nm. Tungsten film 7 is then etched back with a gas based mainly on fluorine.

Figure 2:
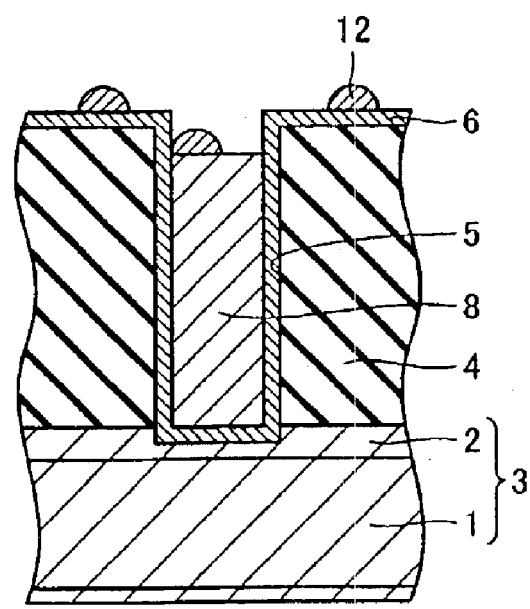

FIG. 2 is a cross section of a wafer after tungsten film 7 has been etched back, as described above. Etching back tungsten film 7 provides tungsten plug 8. On a surface of the first barrier metal 6 and that of tungsten plug 8 deposits a first reaction product 12 for example of titanium fluoride, resulting from etching back tungsten film 7. Note that although FIG. 2 shows the first reaction product 12 depositing in granules, it is merely illustrative and the product may deposits across an entire surface of a wafer to be processed. This also applies to the other embodiments described hereinafter.

The wafer is then transported in a vacuum to an adjacent ashing chamber and thermally processed to decompose the first reaction product 12. More specifically, an oxygen gas is mainly used to ash the wafer. The ashed wafer then has foreign matters and the like removed therefrom. More specifically, it is washed with a solution of hydrogen peroxide and water the conditions presented in Table 1.

TABLE 1

| Step No. | Process | Rate of rotation of wafer to be processed (rpm) | Time (sec) |
| --- | --- | --- | --- |
| 1 | Jetting a solution of hydrogen peroxide (of 30%) | 1,000 | 10 |
| 2 | Washing with water | 1,000 | 15 |
| 3 | Drying | 4,000 | 15 |

The intermediate product having been ashed and washed as described above is shown in FIG. 3 in cross section.

Figure 3:
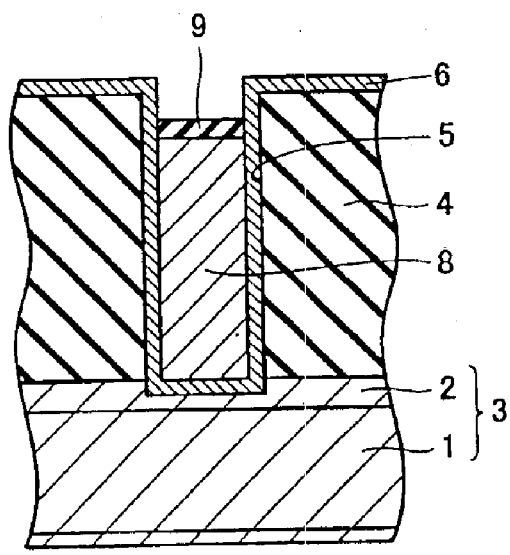

With reference to FIG. 4, after foreign maters have been removed the second interconnection 10 serving as the third conductive film is provided. As shown in FIG. 3, the ashing step provided prior to the washing step using a solution of hydrogen peroxide and water allows a surface of tungsten plug 8 to be covered with oxide film 9. As such, tungsten plug 8 can be prevented from having a reduced film thickness. As such, with reference to FIG. 4, when the second interconnection 10 is provided a film can be readily provided and oxide film 9 and the second interconnection 10 can thus contact each other over a sufficiently increased area. Note that oxide film 9 has a thickness of approximately 3–5 nm, which is so small that the increase in resistance attributed to the existence of oxide film 9 is substantially neglectable. This also applies to each of the embodiments described hereinafter. A stable interconnection structure, allowing small resistance, can thus be obtained.

Figure 5:
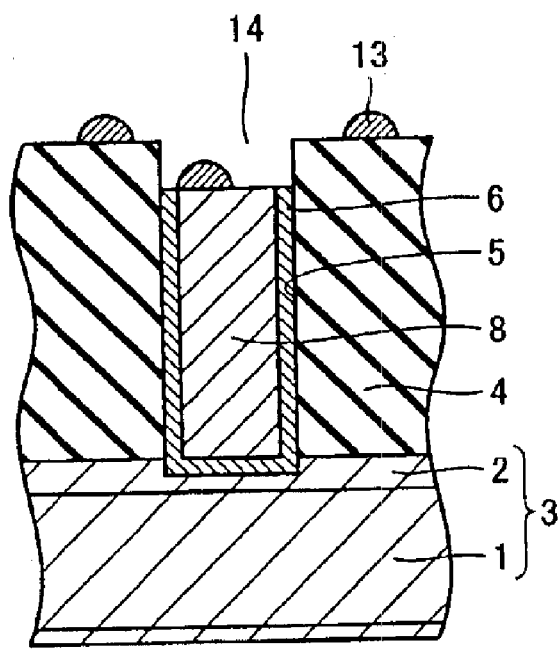
FIGS. 5 and 6 are cross sections illustrating first and second steps characteristic in the process for fabricating the semiconductor device of the present invention in the first embodiment in an exemplary variation.
Figure 6:
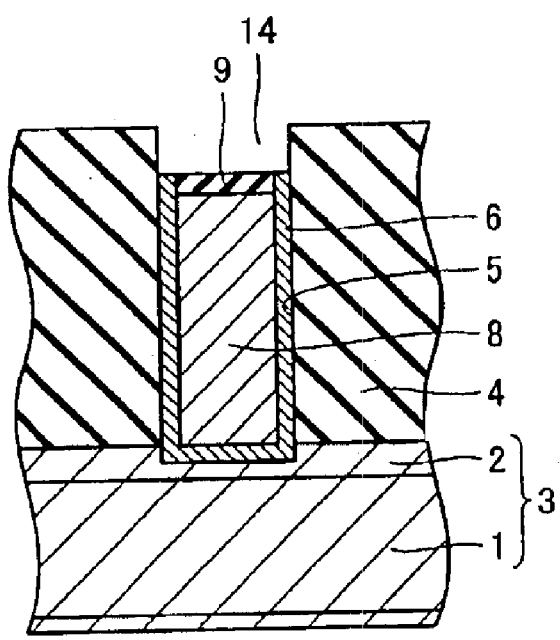
Figure 7:
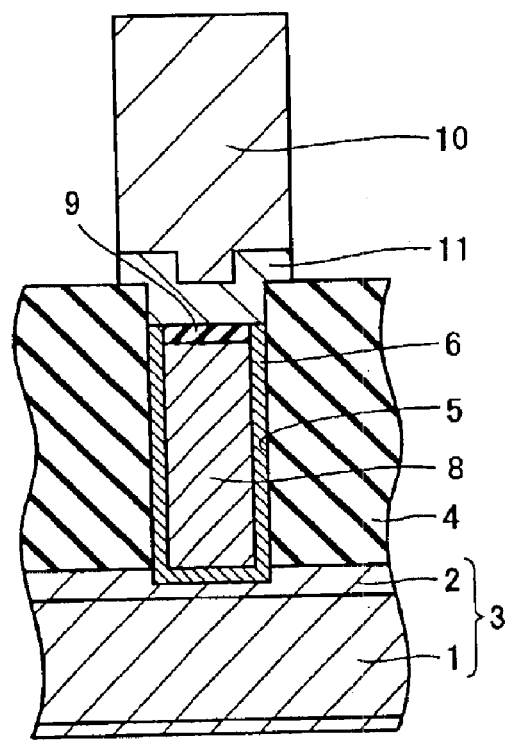
FIG. 7 is a cross section of an exemplary variation of the present semiconductor device in the first embodiment.

FIGS. 5–7 show an exemplary variation corresponding to the semiconductor device fabrication method including each step as described above, except that the step of etching back tungsten film 7 is followed by the step of etching back the first barrier metal 6.

FIG. 5 shows a cross section of the FIG. 2 wafer with the first barrier metal 6 having been etched back with a gas based mainly on fluoride. On a surface of interlayer insulation film 4 and that of tungsten plug 8 there deposits a second reaction product 13 for example of titanium fluoride, resulting from etching back the first barrier metal 6.

The above etching-back step is provided under the conditions presented in Table 2, by way of example. From steps 1 through 3 tungsten film 7 is etched and from steps 4 through 5 the first barrier metal 6 is etched. After the end of step 2 is detected, step 3 provides over-etching for a period of time corresponding to 15% of the total time of steps 1 and 2. Furthermore, after the end of step 4 is detected, step 5 provides over-etching for a period of time corresponding to 50% of the time of step 4.

TABLE 2

| Step No. | Film to be Etched | Gas (m$^3$) SF$_6$ | Gas (m$^3$) Cl$_2$ | Microwave Power (W) | Pressure (Pa) | RF Power (W) | Temp. of Bottom Electrode (° C.) | Time (sec) |
|---|---|---|---|---|---|---|---|---|
| 1 | W | 2.0 × 10$^{-4}$ | 0 | 1000 | 1.0 | 120 | −20 | 21 |
| 2 | W | 2.0 × 10$^{-4}$ | 0 | 1000 | 1.0 | 80 | −20 | Until the end point is detected |
| 3 | W | 2.0 × 10$^{-4}$ | 0 | 1000 | 1.0 | 10 | −20 | 15% |
| 4 | TiN/Ti | 0 | 1.0 × 10$^{-4}$ | 1000 | 0.5 | 100 | −20 | Until the end point is detected |
| 5 | TiN/Ti | 0 | 1.0 × 10$^{-4}$ | 1000 | 0.5 | 100 | −20 | 50% |

After the films have been etched back, the wafer is transported in a vacuum to an adjacent ashing chamber. The wafer is then thermally processed to decompose the second reaction product 13. More specifically, an oxygen gas is mainly used to ash the wafer. Furthermore, the wafer has foreign matters and the like removed therefrom. More specifically it is washed with a solution of hydrogen peroxide and water under the conditions presented in Table 1. The wafer having been ashed and washed, as described above, is shown in FIG. 6 in cross section. The above ashing step is provided under the conditions presented in Table 3, by way of example.

TABLE 3

| Step No. | Gas (m$^3$) O$_2$ | Gas (m$^3$) CHF$_3$ | Gas (m$^3$) H$_2$O | Microwave Power (A) | Pressure (Pa) | Temp. of Bottom Electrode (° C.) | Time (sec) |
|---|---|---|---|---|---|---|---|
| 1 | 8.0 × 10$^{-4}$ | 0 | 0 | 0.4 | 100 | 20–25 | 45 |

After the ashing and washing steps are performed, tungsten plug 8 is provided with re-deposition thereon to provide the second barrier metal 11 and thereon the second interconnection 10 is provided, as shown in FIG. 7.

Note that in this exemplary variation, etching back the first barrier metal 6 reduces a recess 14 by the thickness of the first barrier metal 6 in providing the second interconnection 10 and provides an improved film deposition margin of the second barrier metal 11 and the second interconnection 10. Furthermore, tungsten plug 8 and the second interconnection 10 do not directly contact each other as the second barrier metal 11 is posed therebetween. More reliable interconnection can thus be achieved.

Thus effecting an ashing step, as described above, prior to the step of washing with a solution of hydrogen peroxide and water in FIG. 6, as described above, can prevent tungsten plug 8 from having a reduced film thickness, similarly as has been described with reference to FIG. 4. This can help to form film corresponding to the second barrier metal 11 and the second interconnection 10 and allow oxide film 9 and the second barrier metal 11 to contact each other over a substantially increased area. A stable interconnection structure, providing small resistance, can thus be obtained.

It should be noted that the ashing step corresponding to the thermal processing is preferably performed at a temperature allowing the first and second reaction products 12, 13 to decompose (in the present embodiment, for example the wafer stage has a temperature of approximately 25° C. and the wafer has a temperature of approximately 43° C. to 50° C.). The first and second reaction products 12, 13 resulting from the etching back can thus be removed, and without these layers difficult to control in thickness interposed, tungsten plug 8 and the second interconnection 10 can electrically be connected and more reliable and stable interconnection can thus be provided.

Furthermore, the above ashing step is preferably effected in a processing chamber different from that in which the etching-back step is effected to provide tungsten plug 8. This can help to increase the temperature of an electrode in the ashing step. Furthermore, it is not necessary to change each chamber's temperature with time. This can prevent production of foreign matters. Stable interconnection can thus be provided.

Figure 23:
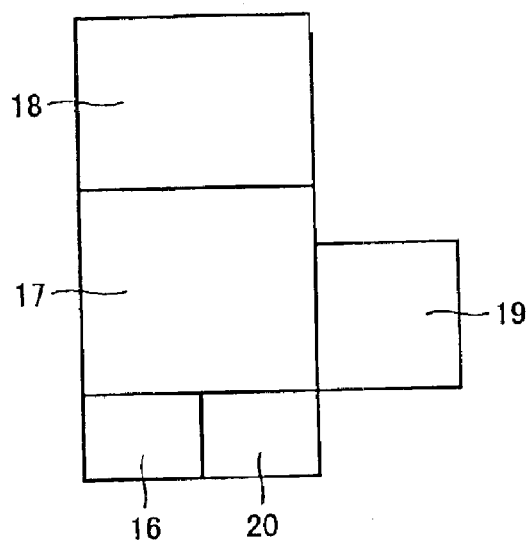
FIG. 23 is a plan view of an etchback apparatus usable in the first to fourth embodiments of the present invention.

With reference to FIG. 23, a wafer to be processed is loaded into an apparatus at a load-lock chamber 16 and transported through a buffer chamber 17 to an etching chamber 18. In the reaction chamber tungsten film 7 is etched back and the first barrier metal 6 is etched back. Subsequently the wafer is transported in a vacuum through buffer chamber 17 to an ashing chamber 19 and in the reaction chamber the wafer is ashed. Subsequently the wafer is transported through buffer chamber 17 and an unload-lock chamber 20 and output from the apparatus. A similar apparatus is also used if the first barrier metal 6 is not etched back and tungsten film 7 alone is etched back.

Note that the present apparatus can be provided by slightly improving an apparatus conventionally used for example in providing tungsten interconnection. For example, an apparatus including ashing chamber 19 with a scheme using only water to cool and adjust the temperature of a bottom electrode may simply have mounted therein a circulator capable of increasing temperature to 250° C. to allow the ashing step at high temperature. As such, the apparatus can be provided without substantially additional cost. Furthermore, a conventional apparatus is also usable as the apparatus of the present embodiment.

In the above ashing step a plasma of oxygen gas is used to increase the temperature of a wafer to be processed, to remove chlorine contained in the first and second reaction products 12, 13, such as $Ti_xF_y$, $Ti_xCl_y$.

Herein oxygen gas and a fluorine containing gas (e.g., $CHF_3$, $CF_4$) are preferably used in the ashing step corresponding to the thermal processing step. Using a fluorine containing gas in addition to oxygen gas can be expected to effectively substitute with fluorine the chlorine contained in the first and second reaction products 12, 13.

The present embodiment thus configured can provide a stable multilayer interconnection structure including a tungsten plug.

Second Embodiment

Figure 8:
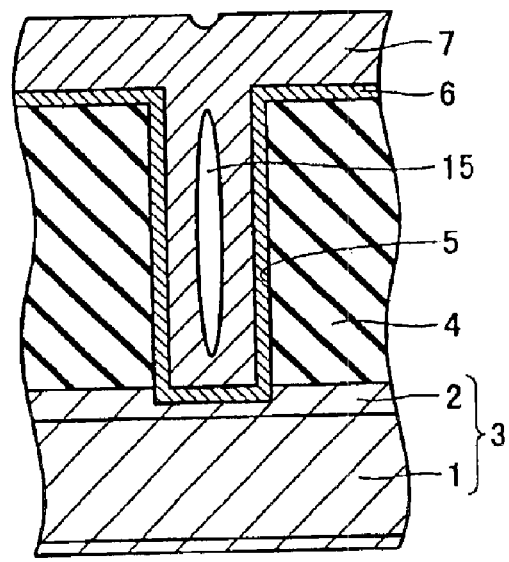
FIGS. 8–10 are cross sections illustrating first to third steps of the process for fabricating the semiconductor device of the present invention in a second embodiment.

The present embodiment provides a semiconductor device corresponding to one exemplary variation assuming a hole having a diameter similar to that of the first embodiment. It is different in that as shown in FIG. 8, contact hole 5 does not have an interior completely filled with tungsten film 7. Instead it has a center with a hollow portion 15.

Figure 9:
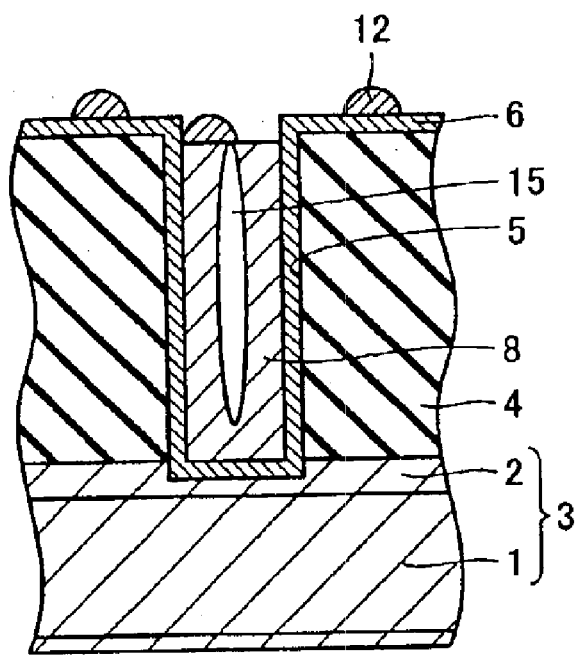
Figure 10:
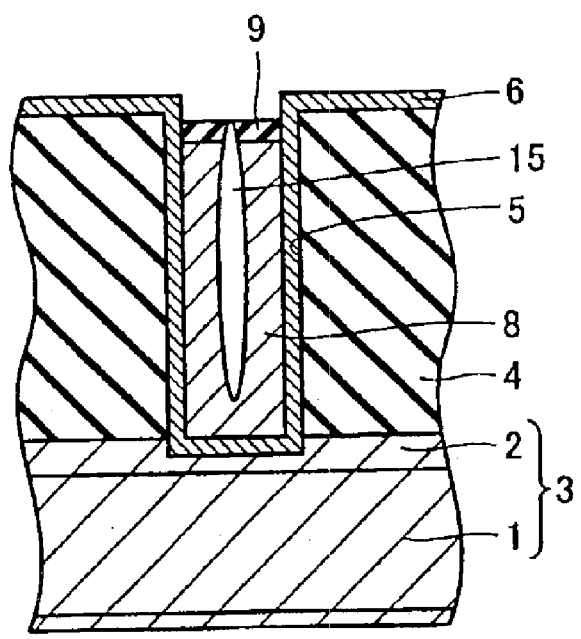

As shown in FIG. 9, after tungsten film 7 is etched back, the first barrier metal 6 and tungsten plug 8 have the first reaction product 12 deposited thereon. Furthermore, as also shown in FIG. 9, the tungsten overlying hollow portion 15 is etched back to expose an upper portion of hollow portion 15 at a surface of the plug. If the intermediate product in this condition is washed with a solution of hydrogen peroxide and water to remove foreign matters and the like, the tungsten existing at an upper portion of hollow portion 15 reacts with fluorine gas remaining on the wafer or the first reaction product 12 or the solution of hydrogen peroxide. This expands a cavity existing at a center of a surface of the plug and as a result tungsten plug 8 has a reduced surface area. This result for example in a reduced area in contact with an aluminum interconnection in a subsequent process step, providing increased resistance of interconnection. To avoid this and maintain the plug's geometry before and after the intermediate product is washed, the intermediate product having been etched back is ashed, similarly as described in the first embodiment, and subsequently washed under the conditions presented in Table 1. The intermediate product having been ashed and washed is shown in FIG. 10 in cross section.

Figure 15:
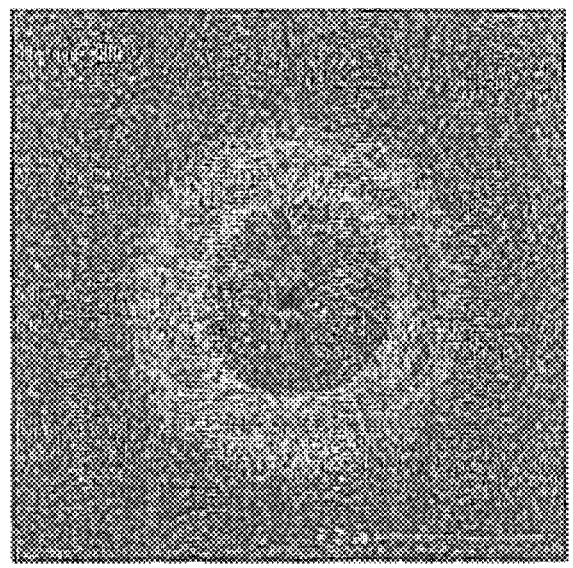
FIG. 15 shows an SEM image of the present semiconductor device in the second embodiment with a tungsten plug having been etched back.
Figure 16:
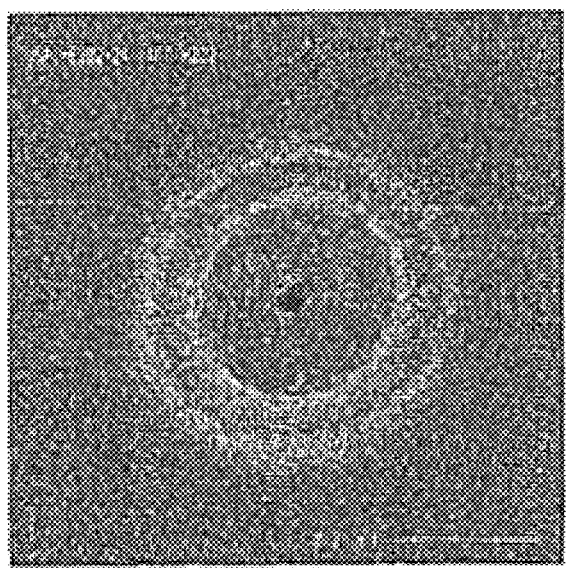
FIG. 16 shows an SEM image of the present semiconductor device in the second embodiment with a tungsten plug having been etched back, ashed and thereafter washed with a solution of hydrogen peroxide.
Figure 19:
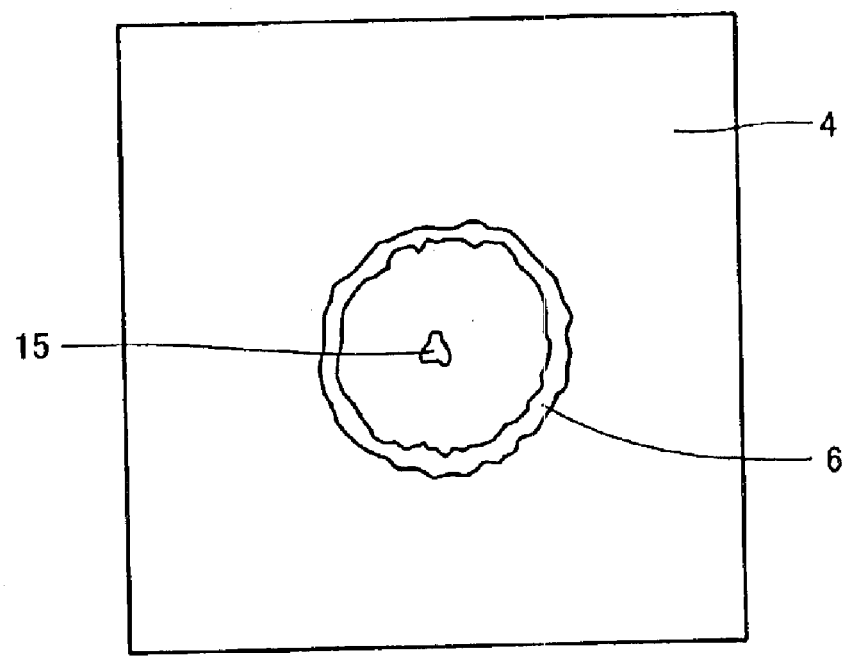
FIGS. 19–22 schematically show the SEM images shown in FIGS. 15–18.
Figure 20:
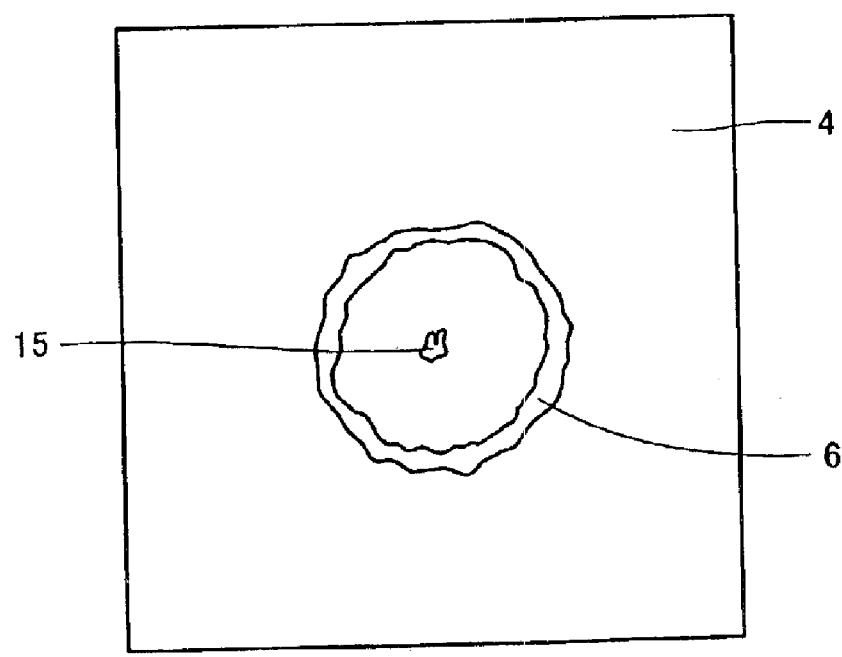

FIG. 15 is a scanning electron microscope (SEM) image of the intermediate product shown in FIG. 9, and FIG. 19 is a schematic diagram of FIG. 15. Furthermore, FIG. 16 is the intermediate product shown in FIG. 15 that has been ashed and washed, as described above, i.e., an SEM image thereof shown in FIG. 10, and FIG. 20 is a schematic diagram of FIG. 16. When FIGS. 15 and 16, or FIGS. 19 and 20 are compared, it can be understood that the first reaction product 12 for example of titanium fluoride having deposited on a surface of the first barrier metal 6 and that of tungsten plug 8 has been decomposed by the ashing step and despite the subsequent washing step hollow portion 15 located at a surface of tungsten plug 8 does not expand.

Figure 11:
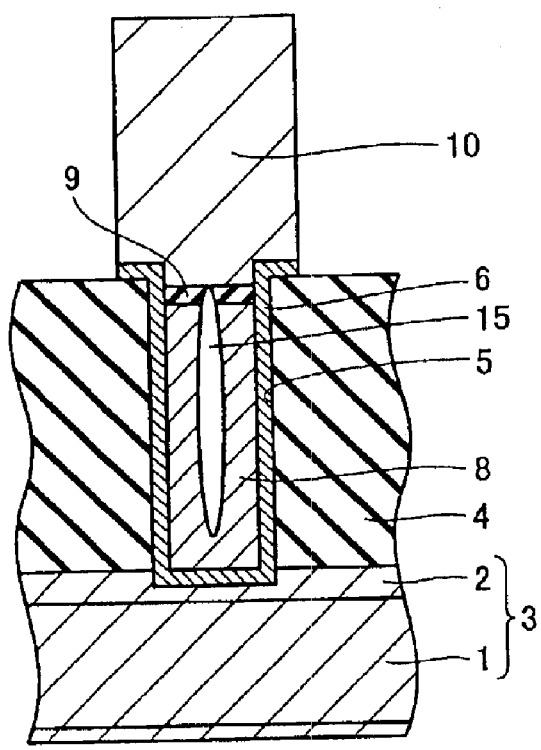
FIG. 11 is a cross section of the present semiconductor device in the second embodiment.

After the above ashing and washing steps are performed, the second interconnection 10 is provided, as shown in FIG. 11. In FIG. 10 before the intermediate product is washed with a solution of hydrogen peroxide and water it is ashed as described above to prevent hollow portion 15 located at a surface of tungsten plug 8 from expanding. Consequently in FIG. 11 when the second interconnection 10 is interconnected a film can be readily provided and a stable interconnection structure, providing small resistance, can be obtained.

Figure 12:
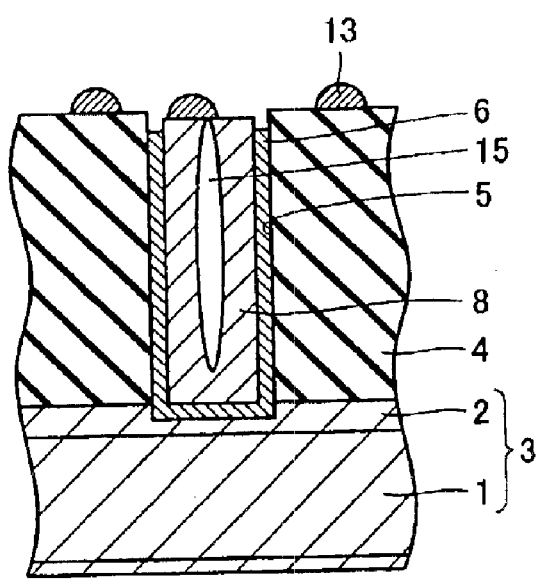
FIGS. 12–13 are cross sections illustrating first and second steps characteristic in the process for fabricating the semiconductor device of the present invention in the second embodiment in an exemplary variation.
Figure 13:
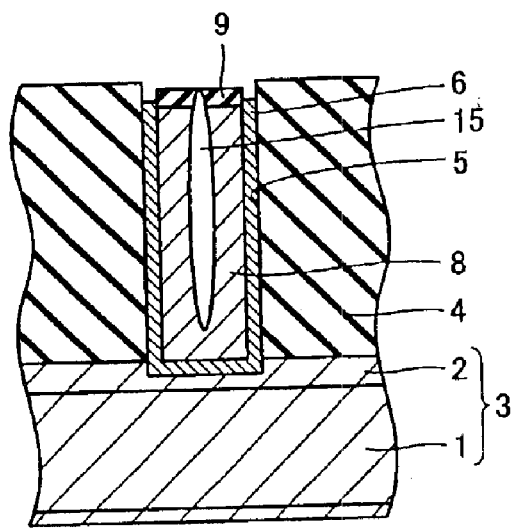
Figure 14:
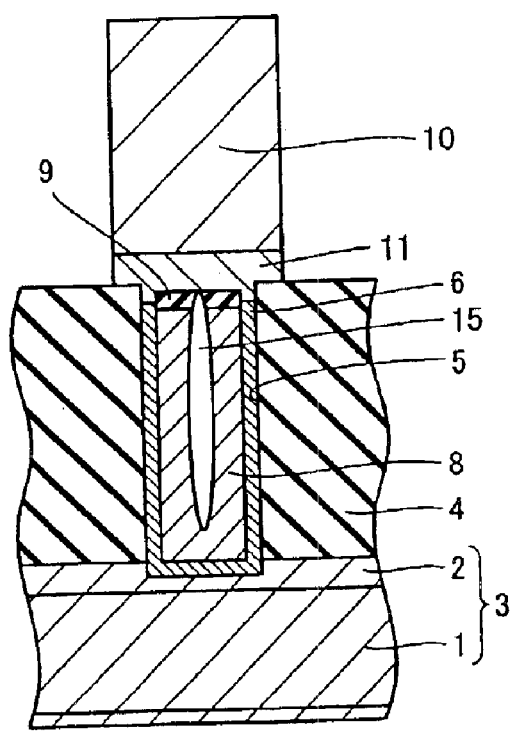
FIG. 14 is a cross section of the present semiconductor device in the second embodiment in an exemplary variation.

FIGS. 12–14 show an exemplary variation of the semiconductor fabrication method. More specifically, it includes each step described above, except that the step of etching back tungsten film 7 is followed by the step of etching back the first barrier metal 6.

FIG. 12 shows a wafer to be processed, as shown in FIG. 9, that has the first barrier metal 6 having been etched back with a gas based mainly on chlorine, as seen in cross section. Interlayer insulation film 4 and tungsten plug 8 each have a surface with the second reaction product 13 for example of titanium chloride depositing thereon, resulting from etching back the first barrier metal 6.

After it is etched back, the wafer is transported in a vacuum to an adjacent ashing chamber. Subsequently, it is thermally processed to decompose the second reaction product 13. More specifically, oxygen gas is mainly used to ash the wafer. The wafer then has foreign matters and the like removed therefrom. More specifically, under the conditions presented in Table 1 a solution of hydrogen peroxide and water are used to wash the wafer. The wafer having been ashed and washed under the conditions presented in Table 1 is shown in FIG. 13 in cross section.

Figure 17:
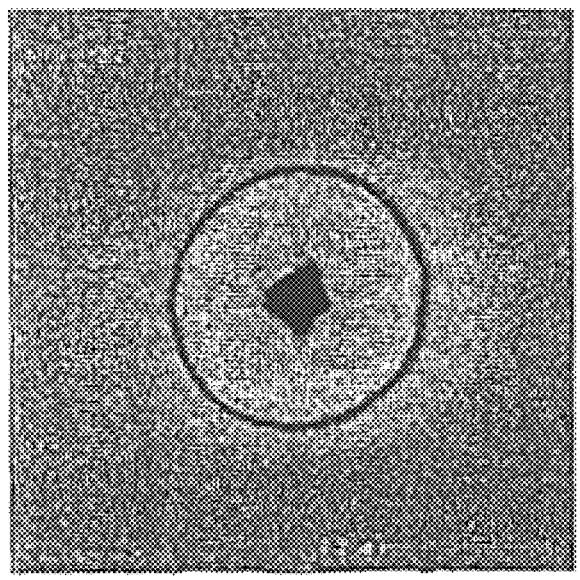
FIG. 17 shows an SEM image of the present semiconductor device in the second embodiment in an exemplary variation with a tungsten plug and a first barrier metal having been etched back.
Figure 18:
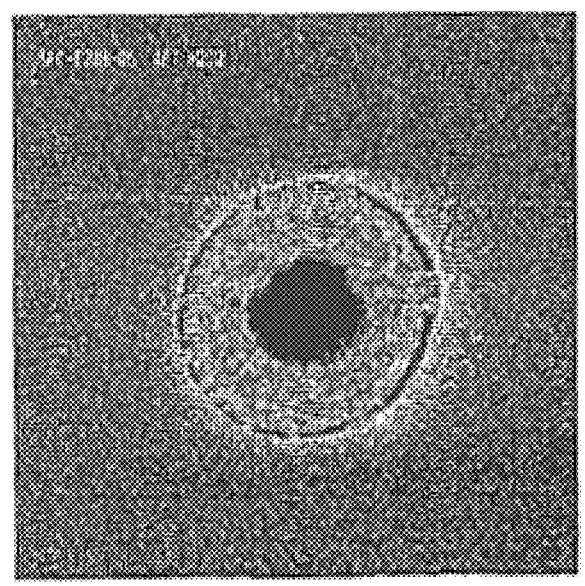
FIG. 18 shows an SEM image of the condition shown in FIG. 17 that has not been ashed and has been washed with a solution of hydrogen peroxide.
Figure 21:
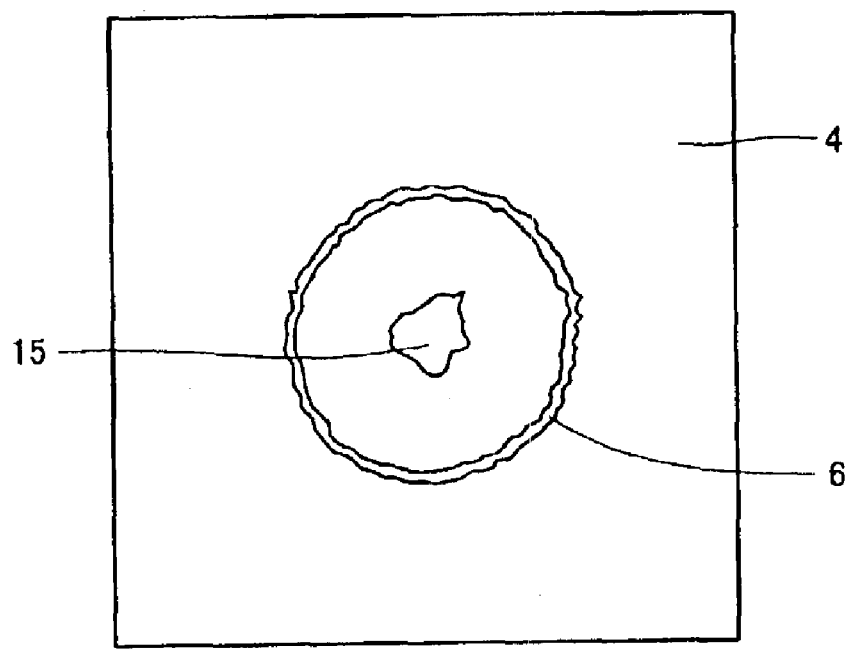
Figure 22:
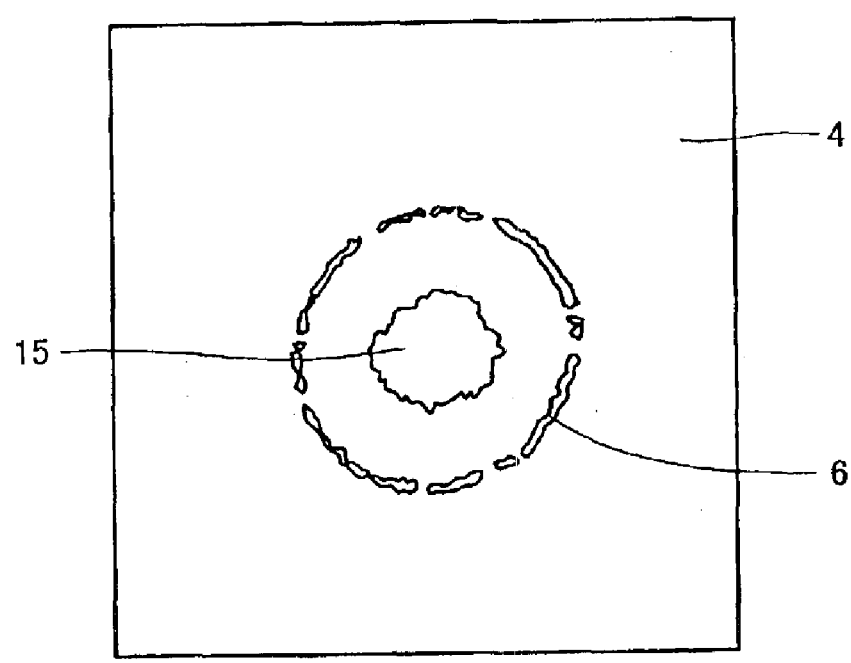

FIG. 17 is an SEM image of the intermediate product shown in FIG. 12 and FIG. 21 is a schematic diagram of FIG. 17. Furthermore, FIG. 18 is an SEM image of the intermediate shown in FIG. 17 that has not been ashed and has simply been washed, and FIG. 22 is a schematic diagram of FIG. 18. A surface of tungsten plug 8 reacts with chlorine gas remaining on the wafer, the second reaction product 13 or the solution of hydrogen peroxide and a cavity located at a center of a surface of the plug expands. This results in a tungsten plug 8 having a reduced surface area and as a result an increased interconnection resistance is provided.

When FIGS. 17 and 18 or FIGS. 21 and 22 are compared, it can be seen that hollow portion 15 at a surface of tungsten plug 8 is enlarged. The above ashing step can prevent the plug from having a reduced surface area, as described above.

After the above ashing and washing steps are performed, tungsten plug 8 is provided with re-deposition thereon to provide the second barrier metal 11 and thereon the second interconnection 10 is provided, as shown in FIG. 14.

Note that in the present exemplary variation, etching back the first barrier metal 6 can reduce recess 14 by the thickness of the first barrier metal 6 in providing the second barrier metal 11 and the second interconnection 10 and provide an improved film deposition margin in providing the second interconnection 10. Furthermore, tungsten plug 8 and the second interconnection 10 do not directly contact each other as the second barrier metal 11 is posed therebetween. More reliable interconnection can thus be achieved.

Thus effecting an ashing step, as described above, prior to the step of washing with a solution of hydrogen peroxide and water in FIG. 13, as described above, can prevent tungsten plug 8 from having a reduced film thickness and hence a reduced surface area. Furthermore in FIG. 14 when the second interconnection 10 is provided film can be readily provided. A stable interconnection structure, providing small resistance, can thus be obtained.

The present embodiment thus configured can provide a stable multilayer interconnection structure including a tungsten plug having a center with a cavity.

Third Embodiment

The present embodiment provides a semiconductor device including a first interconnection 3 serving as a first conductive film, an interlayer insulation film 4 covering the first interconnection 3, an opening provided in interlayer insulation film 4 to reach the first interconnection 3, an oxide film 9 provided at the first interconnection 3 located in the opening, and a tungsten film 7 provided in the opening to surround oxide film 9 to serve as a second conductive film.

In the present embodiment, different from the first and second embodiments, for example for a peripheral circuit portion's alignment pattern, a pattern (an opening) of a hole having a diameter exceeding 0.80 μm is assumed.

Figure 25:
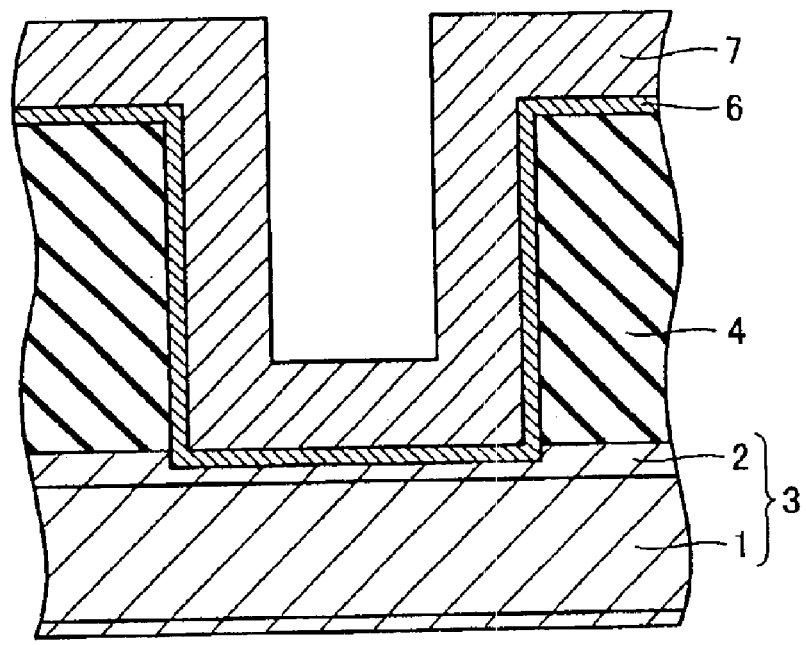
FIGS. 25–27 are cross sections illustrating first to third steps of the process for fabricating the semiconductor device of the present invention in the third embodiment.
Figure 26:
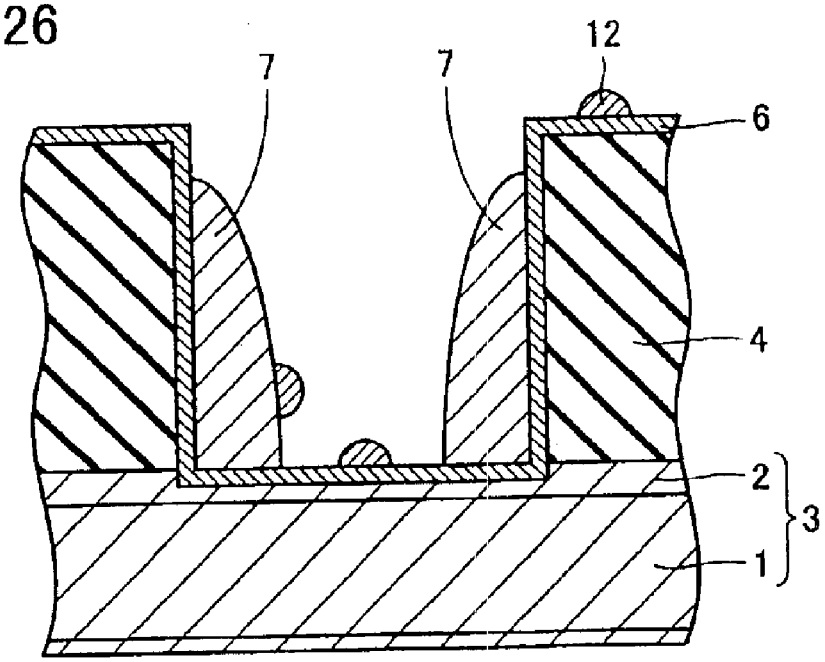
Figure 27:
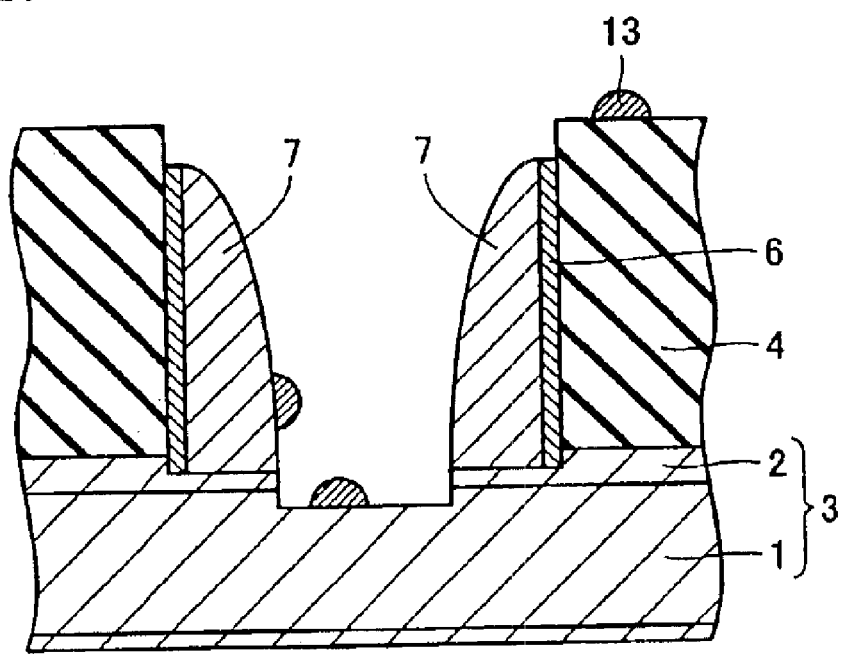

As described in the first embodiment, when a wafer to be processed is provided thereon with tungsten film 7 of approximately 400 nm, tungsten film 7 does not completely fill an alignment pattern's hole, as shown in FIG. 25. The wafer has then tungsten film 7 etched back, as shown in FIG. 26, and it further has the first barrier metal 6 etched back, as shown in FIG. 27. As shown in FIG. 27, the first interconnection 3 is exposed, and the first interconnection 3, tungsten film 7 and interlayer insulation film 4 each have a surface with the second reaction product 13 deposited thereon.

When the intermediate product shown in FIG. 27 is washed with a solution of hydrogen peroxide and water under the conditions presented in Table 1 to remove foreign matters and the like the wafer to be processed is exposed to the air and the first interconnection 3 (e.g., an aluminum interconnection) reacts with chlorine gas or the second reaction product 13 containing chlorine (for example $Al_xCl_y$, $Ti_xCl_y$) that remains on the wafer, i.e., the aluminum is eroded at room temperature.

Figure 28:
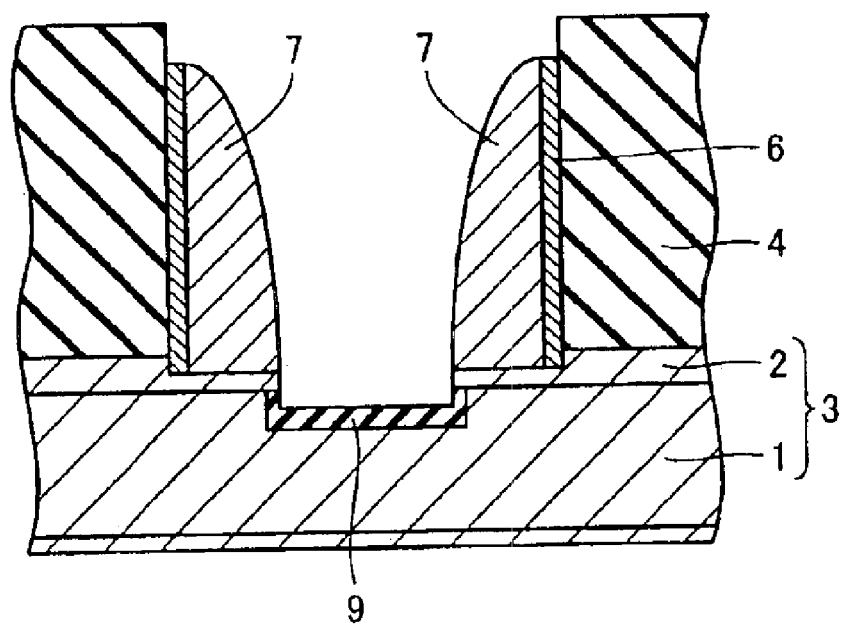
FIG. 28 is a cross section of the present semiconductor device in the third embodiment.

To prevent the erosion, the wafer with the first barrier metal 6 having been etched back, i.e., as shown in FIG. 27, is thermally processed to decompose the second reaction product 13. More specifically, oxygen gas is mainly used to ash the wafer. Subsequently the wafer is washed with a solution of hydrogen peroxide and water under the conditions presented in Table 1 to remove foreign matters and the like. The intermediate product having been ashed and washed, as described above, is shown in FIG. 28 in cross section.

Figure 24:
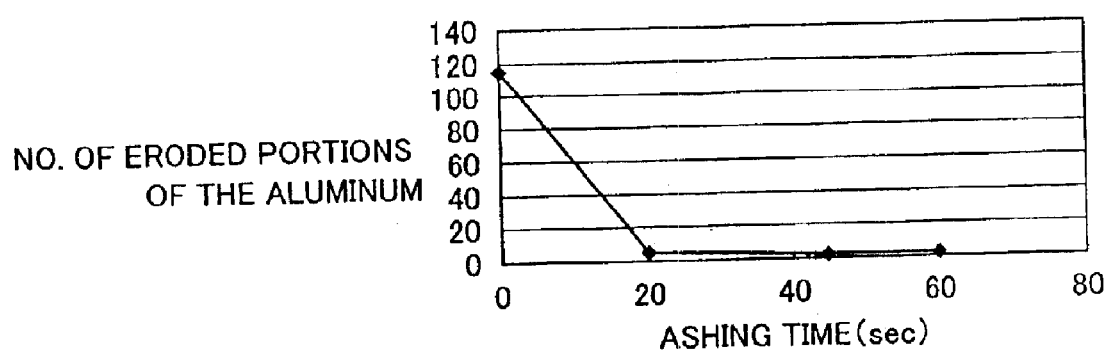
FIG. 24 represents a relationship between an ashing time and the number of eroded portions of aluminum in the third embodiment.

FIG. 24 represents a relationship between the ashing time and the number of eroded portions of the aluminum, as provided when the ashing step is effected under the same ashing condition as presented in Table 3. It can be understood from FIG. 24 that the ashing step contributes to a rapidly reduced number of eroded portions of the aluminum.

Herein oxygen gas and $H_2O$ containing gas are preferably used to provide ashing serving as thermally processing. As has been described above, in the ashing step a plasma of oxygen gas is used to increase the wafer's temperature to eliminate chlorine contained in the first and second reaction products 12, 13. When in addition to oxygen gas, $H_2O$ containing gas is used to effect the ashing step, the following reaction:

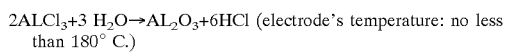

$2AlCl_3 + 3 H_2O \rightarrow Al_2O_3 + 6HCl$ (electrode's temperature: no less than 180° C.)

$AlCl_3 + 3 H_2O \rightarrow Al(OH)_3 + 3HCl$ (electrode's temperature: no more than 180° C.)

occurs.

In particular, when the electrode has the temperature of no less than 180° C. $Al_2O_3$ forms an exposed portion of the first interconnection 3 and a greater effect preventing the erosion can be expected.

The present embodiment thus configured can prevent erosion of aluminum in a large hole pattern such as a peripheral circuit portion's alignment pattern.

Fourth Embodiment

Figure 32:
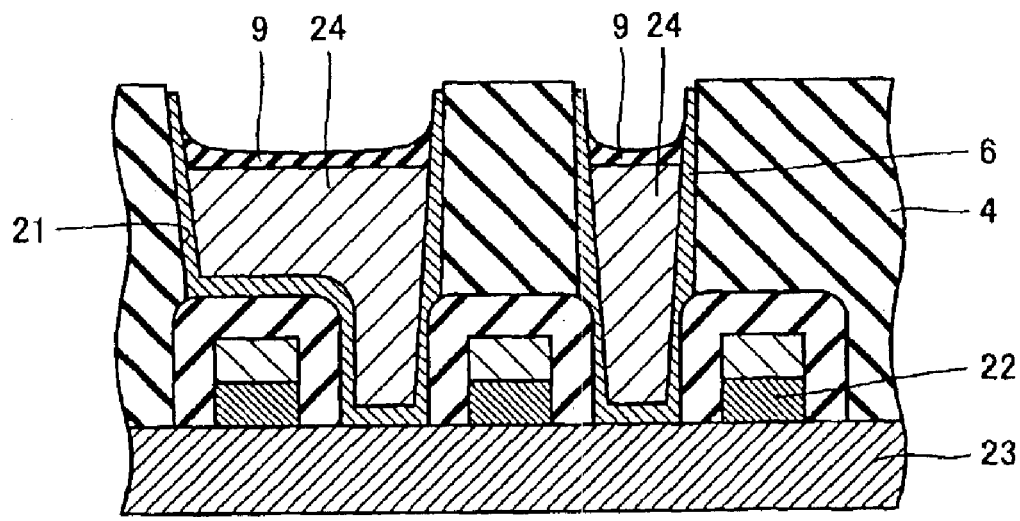
FIG. 32 is a cross section of the present semiconductor device in the fourth embodiment.

In the present embodiment, a buried interconnection with a hole diameter of no more than 0.30 μm is assumed. The present embodiment provide a semiconductor device, as shown in FIG. 32, including a gate electrode 22, a silicon substrate 23 serving as a first conductive film, an insulation film covering gate electrode 22, an interlayer insulation film 4 covering the insulation film and silicon substrate 23, an interconnection trench 21 provided in interlayer insulation film 4 and reaching the insulation film, and also serving as a contact hole, a first barrier metal 6 and a buried interconnection 24 serving as a second conductive film provided in interconnection trench 21, and an oxide film 9 provided at a surface of buried interconnection 24.

In the present embodiment a semiconductor device is fabricated, as more specifically described hereinafter.

Figure 29:
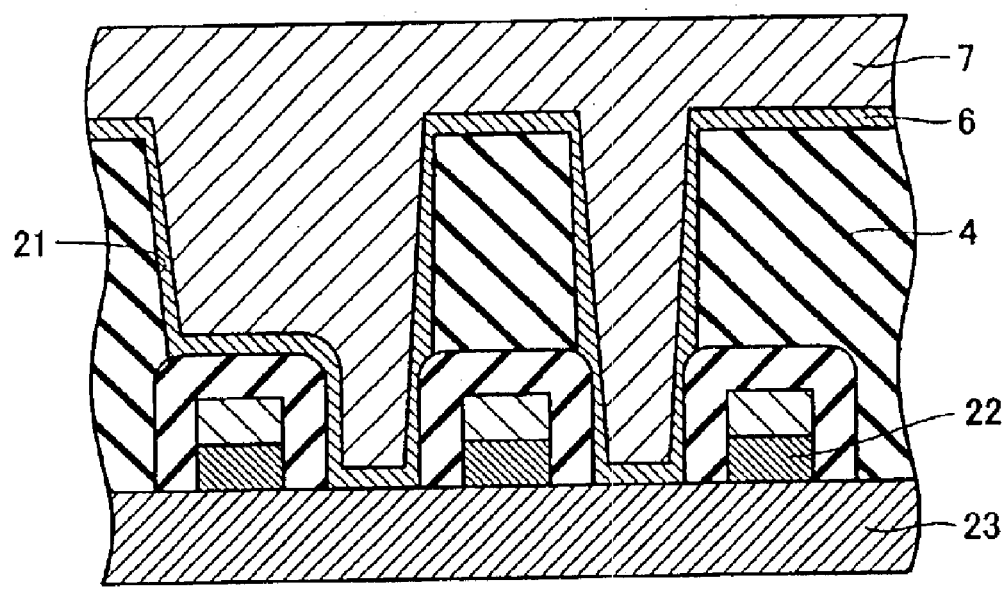
FIGS. 29–31 are cross sections illustrating first to third steps of the process for fabricating the semiconductor device of the present invention in the fourth embodiment.

With reference to FIG. 29, silicon substrate 23 underlies gate electrode 22 formed for example of polysilicon and tungsten silicide. Gate electrode 22 is covered with an insulation film. The insulation film is covered with interlayer insulation film 4 deposited thereon. Dry etching or the like is employed to provide interconnection trench 21 reaching silicon substrate 23 and the insulation film and subsequently in interconnection trench 21 the first barrier metal 6 and tungsten film 7 are provided.

Figure 30:
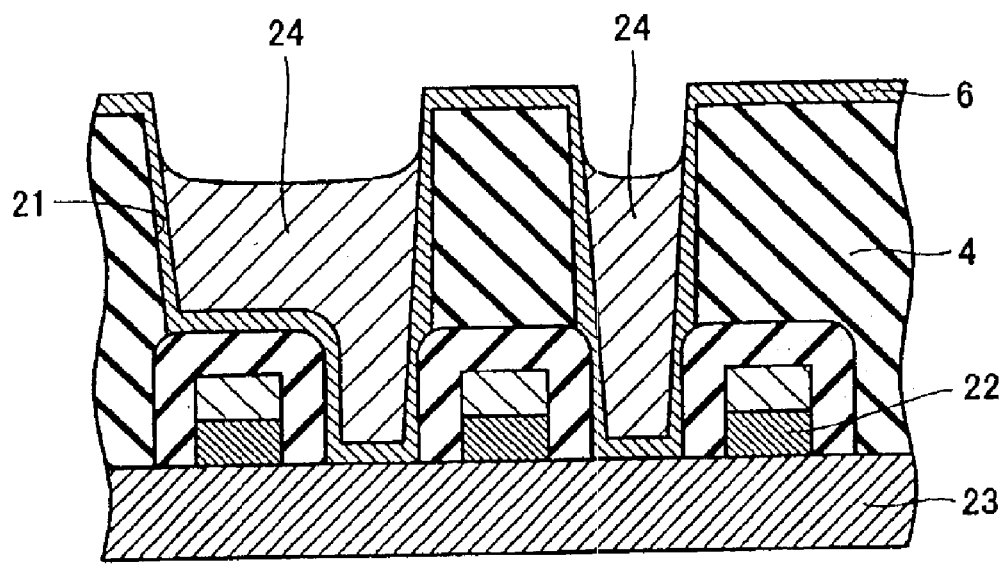
Figure 31:
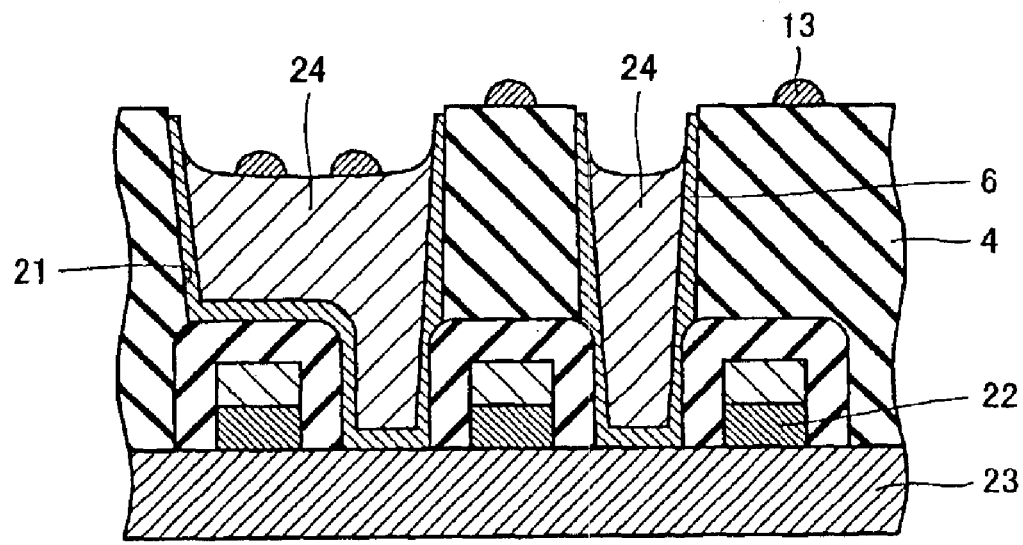

With reference to FIG. 30, tungsten film 7 is etched back with a fluorine based gas and the first barrier metal 6 is then etched back. FIG. 31 shows the intermediate product with the first barrier metal 6 having been etched back with a chlorine based gas. As shown in FIG. 31, the second reaction product 13 containing chlorine deposits on buried interconnection 24 and interlayer insulation film 4.

Figure 33:
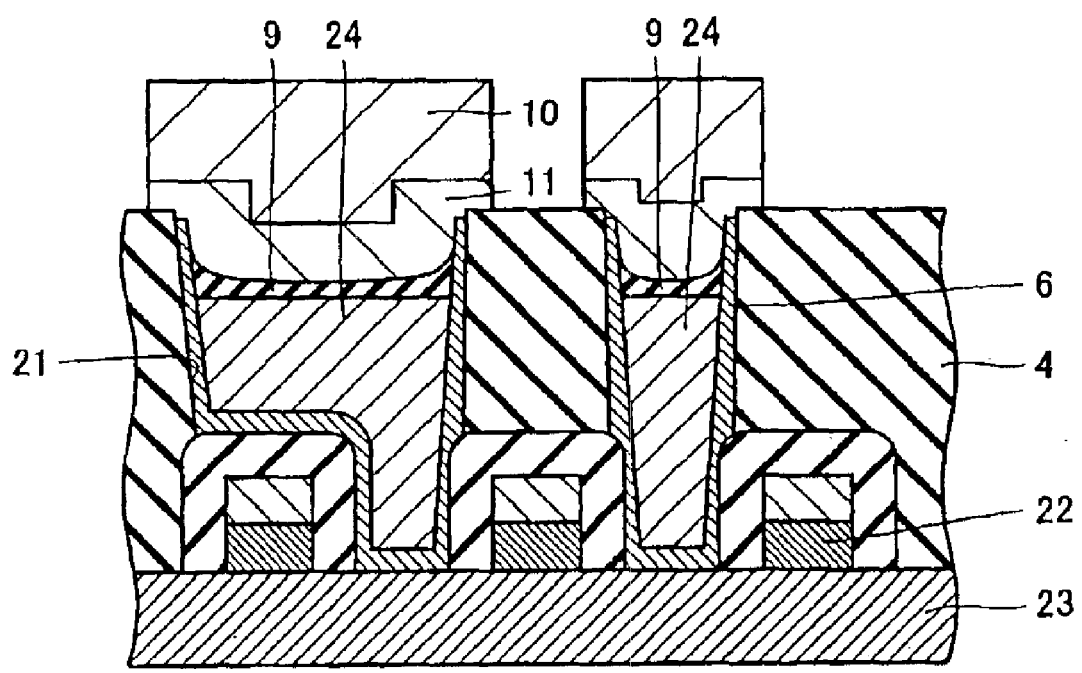
FIG. 33 is a cross section of the present semiconductor device in the fourth embodiment in an exemplary variation.

The wafer as shown in FIG. 31 is transported in a vacuum to an adjacent ashing chamber. Subsequently, it is thermally processed to decompose the second reaction product 13. More specifically, oxygen gas is mainly used to ash the wafer. The wafer then has foreign matters and the like removed therefrom. More specifically, under the conditions presented in Table 1 a solution of hydrogen peroxide and water are used to wash the wafer. The wafer having been ashed and washed as described above is shown in FIG. 32 in cross section. Note that as shown in FIG. 33, on oxide film 9 the second barrier metal 11 may be provided and thereon the second interconnection 10 may be provided.

The present embodiment thus configured can prevent a tungsten film from being reduced, and provide a stable buried interconnection, providing small resistance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, comprising the steps of:

providing an interlayer insulation film covering a first conductive film;

providing a contact hole in said interlayer insulation film to reach said first conductive film;

providing a second conductive film disposed in said contact hole and also extending on said interlayer insulation film;

etching said second conductive film back to provide a plug in said contact hole;

thermally processing a surface of said plug in a processing chamber different from that used for the step of etching to decompose a reaction product introduced by the step of etching at said plug and to form an oxide film on said surface of said plug; and providing a third conductive film on said oxide film over said plug.

2. The method according to claim 1, wherein the step of thermally processing is followed by the step of washing.

3. The method according to claim 1, wherein the step of thermally processing is effected at a temperature allowing said reaction product to decompose.

4. The method according to claim 1, wherein one of oxygen, oxygen and fluorine, or oxygen and H2O containing gas is used to effect the step of thermally processing.

5. The method according to claim 1, comprising forming said oxide film at a thickness of about 3 to 5 nm.

* * * * *